(12) United States Patent  (10) Patent No.: US 6,541,378 B1
Foust et al.  (45) Date of Patent: Apr. 1, 2003

(54) LOW-TEMPERATURE HDI FABRICATION

(75) Inventors: Donald Franklin Foust, Glenville, NY (US); William Francis Nealon, Glenville, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 10/075,684

(22) Filed: Feb. 13, 2002

Related U.S. Application Data

(60) Provisional application No. 60/333,204, filed on Nov. 6, 2001.

(51) Int. Cl.$^7$ ............................................. H01L 21/44
(52) U.S. Cl. ...................... 438/687; 438/598; 438/599; 438/618
(58) Field of Search ................. 438/687, 598, 438/599, 618

(56) References Cited

U.S. PATENT DOCUMENTS

| | | | |
|---|---|---|---|
| 4,783,695 A | 11/1988 | Eichelberger et al. | 357/65 |
| 6,406,991 B2 * | 6/2002 | Sugihara | 438/613 |
| 2001/0019177 A1 * | 9/2001 | Sugihara | 257/780 |

* cited by examiner

*Primary Examiner*—John F. Niebling
*Assistant Examiner*—Lynne A. Gurley
(74) *Attorney, Agent, or Firm*—Duane Morris LLP

(57) ABSTRACT

Components or solid-state chips having electrical contacts containing copper are laminated to Kapton dielectric film, and through vias are formed down to copper-containing material of the component. A fabrication method is described for making reliable connections to the copper-containing materials. The method includes precoating the copper-containing material with SPIE, together with at least argon plasma cleaning, and possibly fluorine plasma etching, of the vias and copper material exposed at the bottoms of the vias.

9 Claims, 13 Drawing Sheets

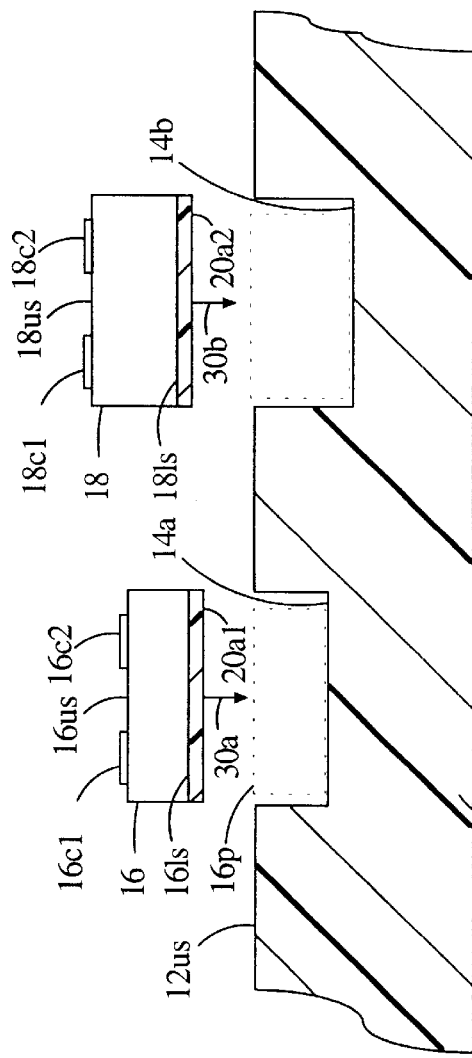
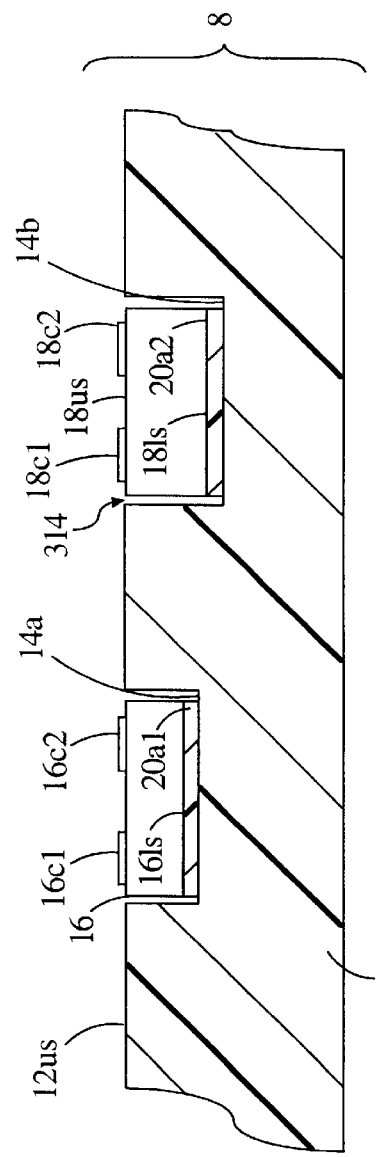
FIGURE 1a
FIGURE 1b

Adhesion of SPIE Laminated to Metals

| Metal | Adhesion (lb/in) | |
|---|---|---|
| | Post Lamination | Post 24 Hour Water Boil |
| Printed Wiring Board Cu | >8 | >8 |
| Cu/Cr | >8 | >8 |
| Cu/Te | >8 | >8 |
| CP1 Ti | >8 | >8 |
| CP2 Ti | >8 | >8 |
| Sputtered Ti | >8 | >8 |
| 304 Stainless Steel | >8 | >8 |
| Alumina-based Ceramic | >8 | >8 |

FIGURE 11a

Adhesion to Titanium

| Material | Adhesion Promoter | Age of Titanium Surface | Age of Adhesion Promoter (days) | Post 24 Hour Water Boil Adhesion (lb/in) |
|---|---|---|---|---|
| CP2Ti | None | >1 Month | – | 0 |
| CP2Ti | VM651 | >1 Month | 1 | Discolored Ti |
| CP2Ti | VM651 | >1 Month | 12 | Discolored Ti |
| CP2Ti | VM651 | Freshly Etched | 12 | Discolored Ti |
| Sputtered | VM651 | Freshly Sputtered | 1 | 0 |
| CP2Ti | T2902 | >1 Month | 5 | >8 |
| CP2Ti | T2902 | Freshly Etched | 15 | >8 |
| CP1Ti | T2902 | >1 Month | 5 | 2-3 |
| CP1Ti | T2902 | Freshly Etched | 15 | 0 |
| Sputtered | T2902 | Freshly Sputtered | 1 | 2 |
| CP2Ti | VM651/T2902 | >1 Month | 12 | 0 to >8 (Variable) |
| CP2Ti | VM651/T2902 | Freshly Etched | 2 | >8 |
| CP2Ti | VM651/T2902 | Freshly Etched | 15 | >8 |
| CP1Ti | VM651/T2902 | >1 Month | 12 | 0 |
| CP1Ti | VM651/T2902 | Freshly Etched | 15 | >8 |
| Sputtered | VM651/T2902 | >1 Month | 21 | >8 |

FIGURE 11b

Detailed Titanium/Copper Process

Acetone Wipe
Iso Propyl Alcohol (IPA) Wipe
Dry
1 min HF (5%), RT
2 min Water Rinse
2 min MicroEtch (14.8 g/L $CuCl_2 2H_2O$ and 12.5% HCl), RT
2 min Water Rinse
2 min HCl (20%), RT 2 min Water Rinse
Scrub Water/IPA
VM651/T2902 Adhesion Promoter in 95% Methanol/5% Water
15 min 100°C
SPIE Varnish (1/4, Oxy Sim 600/Toluene), 2 coats, 50 psi Atomization, 10 psi Material (4 μm)
1 hr 100 °C
1 hr 190 °C
Cool to RT
Scrub Water/IPA
Die Attach Bake
    90 min, 165 °C, $N_2$ hood on hotplate
    Cool to RT
    90 min, 165 °C, $N_2$ hood on hotplate
    Cool to RT
    180 min, 190 °C, vacuum oven
    Cool to RT
IPA Rinse
2 min, $O_2$ RIE
IPA Rinse
VM651/T2902 Adhesion Promoter in 95% Methanol/5% Water
15 min 100 °C
Lamination
Peel
24 hour Water Boil
Peel

FIGURE 12

LOW-TEMPERATURE HDI FABRICATION

This application claims the benefit of Provisional patent application 60/333,204 filed Nov. 6, 2001.

FIELD OF THE INVENTION

This invention relates to methods for fabricating an high-density-interconnect (HDI) assemblages including components which are damaged by high temperature processing.

BACKGROUND OF THE INVENTION

High density interconnect assemblages such as those described in U.S. Pat. No. 4,783,695, issued Nov. 8, 1988 in the name of Eichelberger et al., and in numerous other patents, are finding increased usage. In the typical HDI assemblage, a dielectric substrate such as alumina has a planar surface and one or more wells or depressions. Each well or depression extends below the planar surface by the dimension of a component which is to become part of the HDI assemblage. The component is typically an integrated circuit, having its electrical connections or contacts on an upper surface. These contacts or connections are preferably made from titanium-coated copper-containing metals, so that the later formation of through vias by means of lasers exposes titanium, rather than copper, to avoid oxidation of the copper, which oxidation might affect the adhesion of additional layers. Each component is mounted in a well dimensioned to accommodate the component with its contacts in substantially the same plane as the planar surface of the substrate. The components are typically held in place in their wells or depressions by an epoxy adhesive. A layer of dielectric material such as Kapton polyimide film, manufactured by DuPont of Wilmington, Del., is laminated to the devices using ULTEM polyetherimide thermoplastic adhesive, manufactured by General Electric Plastic, Pittsfield, Mass., which is then heat-cured at about 260° to 300° C. in order to set the adhesive. The polyetherimide adhesive is advantageous in that it bonds effectively to a number of metallurgies, and can be applied in a layer as thin as 12 micrometers ($\mu$m) without formation of voids, and is a thermoplastic material, so that later removal of the polyimide film from the components is possible for purposes of repair by heating the structure to the plastic transition temperature of the polyetherimide while putting tension on the polyimide film.

Following the curing of the ULTEM adhesive layer holding the first sheet of dielectric film onto the components, through via apertures are made through the dielectric film and its adhesive layer at the locations of at least some of the electrical connections. The apertures are typically made by the use of a laser. The laser tends to generate soot as the dielectric and adhesive are vaporized. When the connections are made to copper surfaces, the heat of the laser action also tends to create copper oxides on the connections. The soot and oxides tend to prevent good metal-to-metal contact during later stages of processing which include metal deposition.

Following the drilling of through vias through the first layer of the polyimide film and its polyetherimide adhesive, a patterned layer of titanium/copper/titanium electrical conductors is applied to the exposed surface of the polyimide film, into the through vias, and onto the contacts of the components. This completes the formation of a first layer of electrical connections to the components.

One or more additional thin sheets of polyimide dielectric material are layered onto the upper surfaces using silicone polyimide epoxy adhesive (SPIE). The SPIE is a thermoset material such as OXYSIM 600, manufactured by Occidental Chemical Corporation, Grand Island, N.Y., which is then cured at temperatures below 200°. Once set, the SPIE cannot be softened by heating. Each additional layer of polyimide film has its own pattern of through vias drilled as far as the upper titanium surface of a lower layer of titanium/copper/titanium conductor, followed by its own layer of titanium/copper/titanium deposition. The titanium/copper/titanium layered metallized or deposited conductors are known to provide reliable interconnections.

It has lately become important to integrate into HDI modules certain components including copper-containing electrical connection materials. Such copper-containing electrical contacts are found in at least on-module connection strips, shielding or grounding members, and magnetic components such as tuned ferrite-loaded coils or transformers. These magnetic components tend to be somewhat larger than solid-state chips, but are dimensioned to be accommodated in the HDI modules for which they are intended.

The integration of such modules presents some problems, in that the manufacturers: of the components are accustomed to using copper as the main conductive material, and to making the electrical contacts from copper. Copper is not the best material for electrical contacts in an HDI context, because it oxidizes readily, especially in the presence of high temperatures. Neither titanium nor adhesives reliably adhere to oxidized or dirty copper. Even if they initially appear to adhere, the,adhesion often fails in the presence of heat or moisture. Thus, a copper surface is not acceptable for HDI connection.

Other possible surfaces were evaluated for deposition on the copper of the magnetic components. Electrically deposited and electroless nickel, tin, and palladium were among the surfaces evaluated. It was found that adhesion to nickel was relatively poor for both titanium and adhesive, regardless of how it was deposited. Tin was discounted as a suitable surface, because of the known problem of formation of dendrites. Palladium was also found not to provide good adhesion.

Improved HDI processing methods are desired.

SUMMARY OF THE INVENTION

A method for making a high-density interconnection between at least one component and one interconnection sheet includes the step of procuring a component having copper-containing electrical contacts lying in a common plane, and procuring a film of polyimide dielectric material. The method includes the laminating of the film to at least the electrical contacts of the component using a layer of silicone polyimide epoxy adhesive. Following the laminating step, laser-formed vias are defined through the film of polyimide epoxy adhesive, and any polyimide dielectric material which may overlie the contacts, to at least some of the electrical contacts of the component. As a result, soot and copper oxides may undesirably remain on the electrical contacts. At least the vias and that portion of the electrical contacts exposed at the bottoms of the vias are cleaned by at least argon reactive ion etching. Metallization is applied to at least the cleaned vias and contacts, to form a path for the flow of electricity through the film of polyimide;dielectric material to the electrical contacts, and to thereby define the interconnection sheet. In one version of the method, the step of laminating the film to at least the electrical contacts of the component using a layer of silicone polyimide-epoxy adhesive includes the step of curing the silicone polyimide epoxy adhesive. The curing may take place at a temperature not greater than about 190° C.

A method for making a high-density interconnection between at least one component and a high-density interconnection sheet according to another aspect of the invention includes the step of procuring a component having copper-containing electrical contacts lying in a common plane, and having a selected dimension in a direction perpendicular to the common plane. In one version, the step of procuring the component includes the step of procuring a magnetic component. The method also includes the step of procuring a dielectric substrate, which may be partially or wholly metallized, and which includes or defines a generally planar surface. The generally planar surface defines a first aperture extending below the planar surface by the selected dimension or otherwise dimensioned to accommodate the component with the common plane substantially coincident with the planar surface. The component is fastened within the aperture, with its electrical contacts lying in a plane substantially coincident with the planar surface. A film of polyimide dielectric material is procured. The film is laminated to at least,the-electrical contacts of the component, and preferably to surrounding portions of the dielectric sheet, using a layer of silicone polyimide epoxy adhesive, and the epoxy adhesive is cured at a temperature not greater than about 190° C. Following the curing step, laser-generated vias are formed through the film of polyimide epoxy adhesive and any polyimide dielectric material to at least some of the electrical contacts of the component. If the copper or copper-containing contacts are subject to laser action, soot and copper oxides may undesirably remain on the electrical contacts after the lasering. At least the through vias and that portion of the electrical contacts exposed at the bottoms of the vias are cleaned by at least argon reactive ion etching, to generate cleaned vias and contacts. Following the cleaning, at least the cleaned vias and contacts are metallized to thereby define the interconnection sheet, and to form a path for the flow of electricity through the film of polyimide dielectric material to the electrical contacts.

In one version of the method according to an aspect of the invention, the step of laminating the film includes the step of applying the silicone polyimide epoxy adhesive to a thickness of about ⅕ ($10^{-4}$) meter. In another version, the step of procuring a component includes the step of procuring a component in which the electrical contacts include a copper-containing material coated with titanium, and the cleaning step includes the preliminary step of reactive ion etching with titanium fluoride, to thereby remove the titanium.

In another mode of the method according to an aspect of the invention for fabricating a conductive via between an upper surface of a dielectric sheet and a metallization on a component to which the via is to be connected, a component is procured defining first and second substantially parallel surfaces, defining a thickness therebetween, and including at least one electrical connection material on the first surface thereof, which electrical connection.material includes copper. A substrate defining a planar surface is provided. The substrate defines at least one well extending below the planar surface, which well has a depth substantially equal to the thickness of the component. The component is mounted in the well with the first surface of the component substantially coplanar with the planar surface of the substrate. A sheet of polyimide dielectric material is bonded to at least the first surface of the component. A via is formed using a laser. The via extends through the sheet of dielectric material at a location over the electrical connection material of the component. The formation of the via using a laser undesirably tends to create soot, and also undesirably tends to create oxides of copper on the electrical connection material. At least the via and that portion of the electrical connection material exposed by the laser drilling action are cleaned by steps including (a) reactive ion etching using a fluorine-containing plasma; and (b) following the step of reactive ion etching using a fluorine-containing plasma, reactive-ion etching using an argon-containing plasma. Following the step of cleaning the via, metallization is applied to the via and to that portion of the electrical connection material exposed by the via.

BRIEF DESCRIPTION OF THE DRAWING

FIG. 1 is a simplified cross-sectional illustration of an HDI substrate defining wells, showing representative components which may be mounted therein, and FIG. 1b is a simplified cross-sectional illustration of the HDI substrate of FIG. 1a with the components mounted in the wells;

FIG. 11a tabulates adhesion of SPIE laminated to metals, and FIG. 11b tabulates adhesion to titanium; and FIG. 12 sets forth details of a titanium/copper process.

DESCRIPTION OF THE INVENTION

Figure 2:
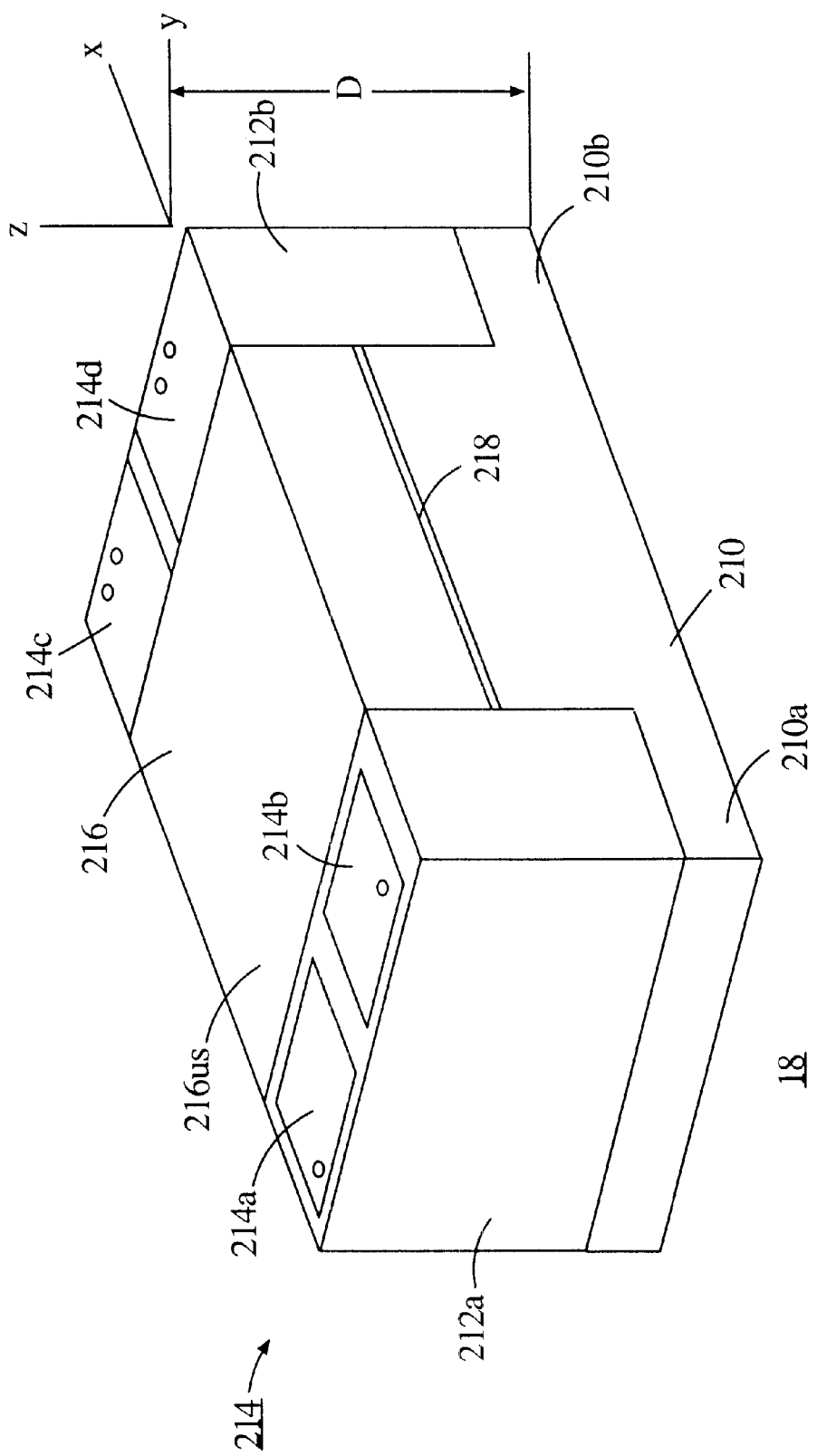
FIG. 2 is a simplified perspective or isometric external view of a magnetic component which might be used in an HDI context, showing possible electrical contact locations.

In FIG. 1a, a high-density-interconnect (HDI) dielectric substrate 12 defines a planar upper surface 12us, and first and second wells 14a and 14b depressed below surface 12us. Instead of wells, through apertures could be used. As illustrated, a first component 16 defines an upper surface 16us and a lower surface 16ls. Upper surface 16us of component 16 bears a plurality of electrical connections, two of which are illustrated as 16c1 16c2. The phantom lines 16p illustrate the location of component 16 when mounted in well 14a. When component 16 is mounted within well 14a, the plane of its upper surface 16us is substantially coincident with the plane of upper surface 12us of dielectric substrate 12. Also in FIG. 1, a second component 18 defines an upper surface 18us and a lower surface 18ls. Upper surface 18us of component 18 bears a plurality of electrical connections, two of which are illustrated as 18c1 and 18c2. The phantom lines 18p illustrate the location of component 18 when mounted in well 14b. When component 18 is mounted within well 14b, the plane of its upper surface 18us is substantially coincident with the plane of upper surface 12us of dielectric substrate 12. The thickness of the electrical electrical connections is normally very small, so that there is essentially no difference between the upper surface of the component and the plane of the connections. Components 16 and 18 are illustrated as having different thicknesses, as measured between their upper and lower surfaces. This might be the case if, for example, component 16 were an integrated circuit and component 18 were a magnetic component such as a transformer or some component other than a solid-state chip.

FIG. 1b illustrates the components 16 and 18 of FIG. 1a mounted within the wells 14a and 14b, respectively, of the substrate 12 of FIG. 1a, by the use of adhesive or epoxy 20a1 and 20a2, respectively.

FIG. 2 illustrates a magnetic component which corresponds with component 18 of FIG. 1. In FIG. 2, the magnetic component is illustrated as having an elongated cubic shape. A lower portion designated 210 is a ferrite slab, having ears 210a and 210b. Ear 210a supports a roughly cubic insulator 212a, and ear 210b supports a similar insulator 212b. Insulators 212a and 212b have a set 214 of deposited copper or copper-containing, mutually isolated connection electrodes formed or placed on their planar upper surfaces. Insulator 212a supports copper-containing, mutually-electrically-isolated contact electrodes 214a and 214b, and insulator 212b supports similar copper-containing mutually isolated connection electrodes 214c and 214d on its planar upper surface, coplanar with electrodes 214a and 214b. All or some of the electrical contact electrodes of set 214 make connection with turns of conductor associated with the ferrite body 210. FIG. 2 also illustrates a ferrite lid or cap 216, which joins ferrite element 210 in conventional fashion to form a closed magnetic path. The upper surface 216us of lid 216 is substantially coplanar with the electrodes 214a, 214b, 214c, and 214d. A structure similar to that of FIG. 2 may be used as a transformer, or it may be used as an inductor, in which case only two of the electrodes would be necessary, rather than four. In one advantageous embodiment, the magnetic element is part of a resonant circuit, which may include nonmagnetic elements located within the body of element 18. In such a structure, tuning of the resonant circuit is accomplished by fastening lid 216 to ferrite part 210 with epoxy or other hardenable adhesive, and applying force to or "pressing" the lid 216 while the epoxy or adhesive is soft or uncured so as to obtain suitable tuning performance, and leaving the lid in the correct position until the epoxy or adhesive hardens or sets. It has been found that the material 218 is somewhat sensitive to temperature, in that it may be damaged at temperatures in excess of about 180° C. If magnetic component 18 of FIG. 2 were to be used as component 18 of FIGS. 1a or 1b, electrode 214b of FIG. 2 might be deemed to correspond with connection 18c1 of FIGS. 1a and 1b, and electrode 214d of FIG. 2 to correspond to connection 18c2 of FIGS. 1a and 1b.

According to an aspect of the invention, the copper-containing connection electrodes 214a, 214b, 214c, and 214d of component 18 of FIG. 2 are cleaned, and then coated with a material which both protects the copper against oxidation and to which adhesion of other materials is good. The cleaning can be performed in many ways, but one way includes degreasing by wiping the copper surface with acetone, followed by isopropyl alcohol (IPA), then drying. After the drying, controlled copper removal is performed by means of a two-minute copper chloride etchant with Micro-Etch at 14.8 g/L $CuCl_2 2H_2O$ and 12.5% HCl. The etching step is preferably accomplished by spot application of the etchant to the copper surface itself, rather than by immersion of the entire component 18 of FIG. 2, to avoid possible penetration or perfusion of the etchant into the interior of the component. The copper chloride etching step is followed by a two-minute water rinse, in turn followed by a two-minute 20% hydrochloric acid (HCL) exposure at room temperature, again preferably without immersion. Water rinses are preferably deionized water rinses. Following the HCl exposure, a further two-minute water rinse is performed, followed by a high-pressure water scrub, and an isopropyl alcohol (IPA) drying chaser. The copper-containing electrode material is deemed to be clean following the cleaning steps. The coating steps should be performed soon after the cleaning, to avoid re-oxidization of the copper-containing material of the electrical contacts.

The next step in the preparing the set 214 of electrodes of FIG. 2 for coating is the step of adhesion promotion. Many types of adhesion promoters can be used, but the system used in a mode of the method according to an aspect of the invention includes silane coupling agents. More particularly, type VM651 adhesion promoter, fabricated by HD Microsystems of Parlin, N.J., or United Chemical Technologies type T2902 adhesion promoter can be use. The selected adhesion promoter is dissolved in 95% methanol, 5% water, to a concentration of about 0.01%, and the resulting solution is applied to: the copper-containing surfaces to be protected, as by swabbing (for discrete electrodes) or spin-coating (for flat surfaces). A drying step of baking for 15 minutes at 100° C. follows the application of the adhesion promoter.

According to a further aspect of the invention, the cleaned copper-containing, adhesion-promoted electrodes of the component, or other copper-containing surfaces to be protected, are immediately coated with silicone polyimide epoxy (SPIE), which is the same thermoset material which is used to bond together upperlayers of the HDI interconnect.

It has been found that this material provides adequate protection of the copper-containing material of the component during those times in which the component is being processed for mounting on an HDI substrate. More particularly, one part of Oxy Sim 600 SPIE is combined with four parts of solvent to make the solution which is applied.

Figure 3:
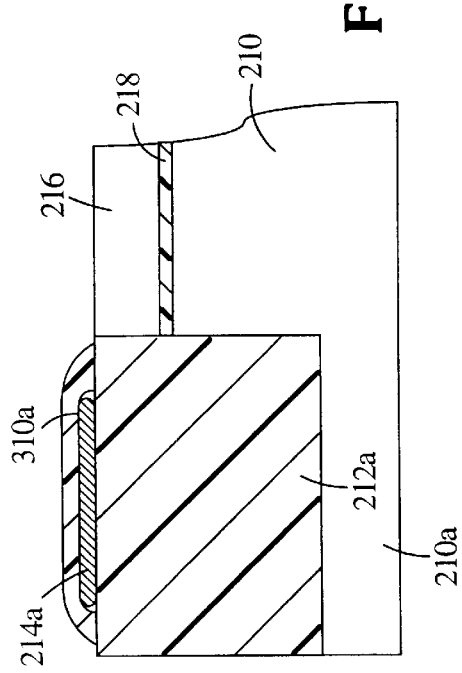
FIG. 3 is a simplified cross-section of a portion of the component of FIG. 2 illustrating coating of the copper-containing connection electrode with SPIE.

In one version of this coating, the solvent is toluene. Two coats of the SPIE material are applied in this version of the method according to this aspect of the invention, to any desired thickness, which in one version is 4 micrometers ($\mu$m). Following the application of the SPIE solution to the copper-containing electrodes, two bakes are performed, the first to remove or drive off the solvent, the second to cure the epoxy. These bakes are 1 hour at 100° C. and 1 hour at 190° C., respectively, in one variant of the method according to an aspect of the invention. FIG. 3 illustrates a cross-section of component 18 of FIG. 2 in the region of contact or connection electrode 214a, showing the protective layer 310a of SPIE thereon.

Following the baking steps, the copper-containing material or set 214 of electrodes of FIG. 2, including electrode 214a of FIG. 3, are brought to room temperature, and the component 18 of FIG. 2 is prepared for component or die attachment by means of another pressure wash with water followed by drying with isopropyl alcohol. The component or die attachment is performed in conventional HDI manner as suggested in conjunction with FIGS. 1a and 1b; in one version, a thermoset epoxy such as 20a1 and 20a2 of FIG. 1b is applied in (or to) the wells 14a andor 14b, or to the underside of the components, and the component is inserted into the well as suggested by the arrows 30a, 30b of FIG. 1a, to form a populated substrate (the HDI substrate 12 with its.attached components such as 16, 18) 8 as illustrated in FIG. 1b. The entire populated substrate 8 is then baked 90 minutes at 165° C., preferably under a $N_2$ hood, and then cooled to room temperature to cure the adhesive. If additional components are to be added to a partially populated substrate, the thermoset epoxy is added to the additional wells with the appropriate components, followed by another baking for 90 minutes at 165° C. These additions of adhesive and components to the wells, and the bakings and coolings, can continue until all components have been attached. Following the baking of the last adhesive, the populated HDI substrate 8 is outgassed by baking at 190° C. for 180 minutes in a vacuum oven. The populated substrate 8 is then cooled to room temperature. This completes the die or component attachment. The SPIE coating 310 on the set 214 of copper-containing electrodes of the component 18 protects the copper against oxidation at the baking temperatures required to set and outgas the adhesives during die attachment. In preparation for the next step, which is lamination, it may be desirable to fill any gaps, such as gap 314 of FIG. 1b, lying between substrate 12 and the component 18, with an epoxy or other filler material. The filler material is illustrated as 410 of FIG. 4.

According to another aspect of the invention, the populated substage 8 is prepared for lamination by cleaning the oxides from any exposed copper-containing materials. The oxide removal is performed by a process beginning with an IPA rinse. The IPA rinse is followed by a two-minute $O_2$ reactive ion etch (RIE), which is a trifle more aggressive than an oxygen cleaning plasma. This is followed by another IPA rinse. The copper-containing material is deemed to be cleaned of oxides by this process.

Figure 4:
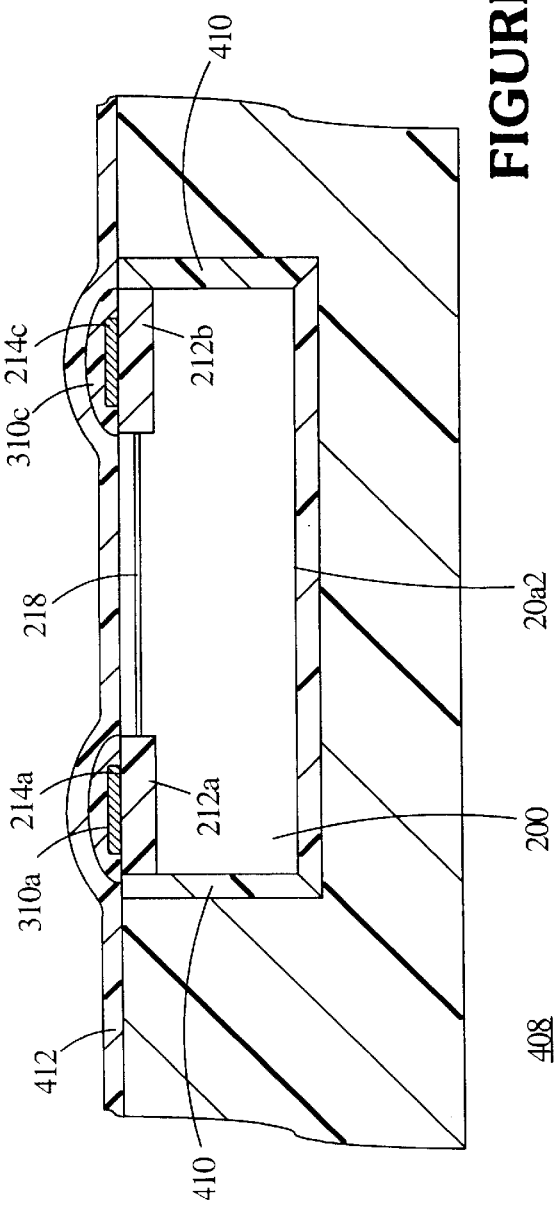
FIG. 4 is a simplified cross-section of the component of FIG. 2 mounted in the manner shown in FIG. 1b, with a layer of adhesion promoter applied thereon.

Following the copper oxide removal, the upper surface of the populated substrate 8 is prepared for lamination by adhesion promotion. The preparation for lamination includes dissolving the VM651 or T2902 adhesion promoter in 95% methanol, 5% water, to a concentration of about 0.01%, and application of the resulting solution to the entire upper surface of the populated substrate, as by swabbing or spin-coating, to form an adhesion promoter coating illustrated as 412 in FIG. 4. A drying step of baking for 15 minutes at 100° C. follows the application of the adhesion promoter solution to the surface. This is followed by fifteen minutes of baking at 100° C. for driving out solvent, to produce a layer of cured SPIE. The populated substrate with adhesion promoter 408 as illustrated in FIG. 4 is now ready for lamination.

Figure 5A:
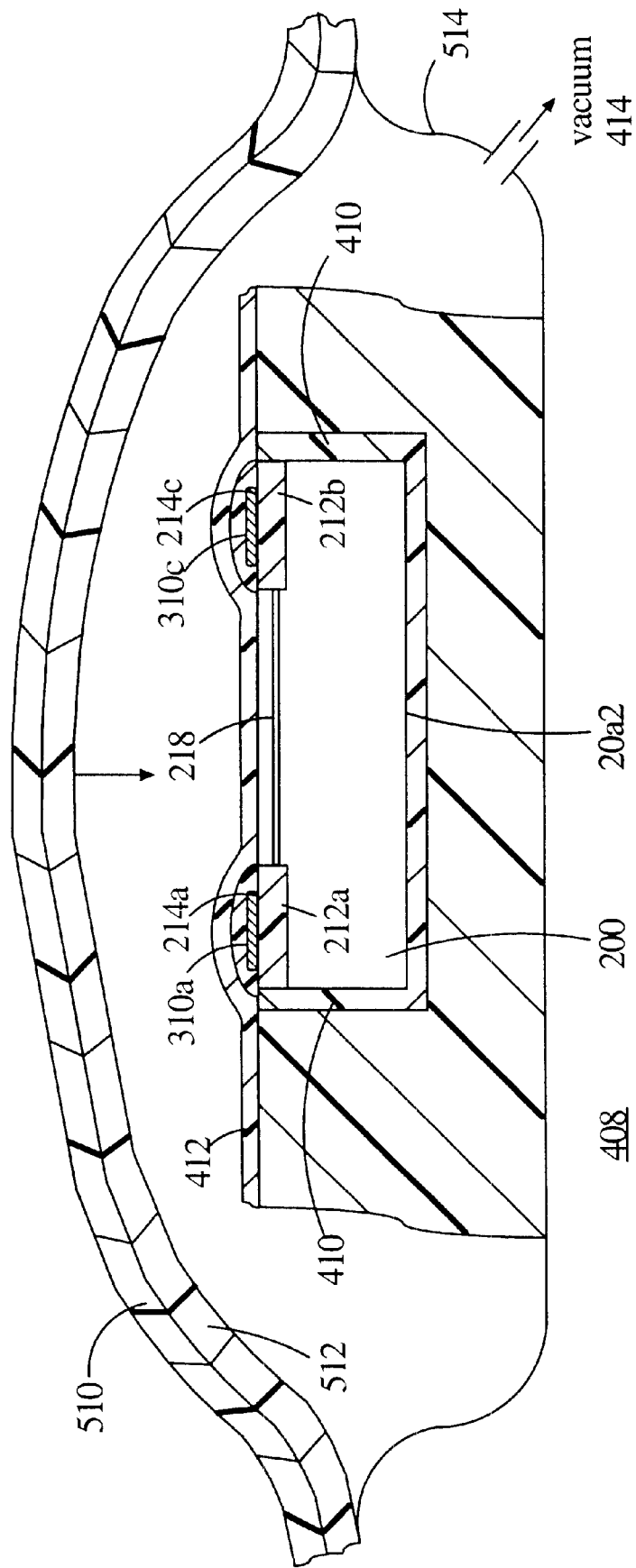
FIG. 5a illustrates vacuum application of uncured-SPIE-coated Kapton polyimide sheet to the upper surface of the structure of FIG. 4.

In general, the lamination is accomplished by use of a vacuum, which brings an uncured-SPIE-coated film of Kapton polyimide 510 into contact with the adhesion promoter 412 already applied to the contact areas of the populated substrate 408. More particularly, a sheet 510 of Kapton polyimide is cleaned and coated with a layer 512 of uncured SPIE, as illustrated in FIG. 5a. In one version, the thickness of the SPIE layer was 20 ($10^{-6}$) meter, corresponding to ⅕ ($10^{-4}$) meter. The uncured-SPIE-coated polyimide sheet 510, 512 is applied over the opening of a vacuum vessel 514 containing the populated substrate 408, and a vacuum 414 is applied to move the uncured SPIE layer 512 of its supporting Kapton polyimide sheet 510 in the direction of arrow 516, and into contact with the adhesion promoter 412 of the populated substrate 408. The SPIE layers bond together through the intermediary adhesion promoter, thereby attaching the Kapton dielectric sheet 510 to the populated substrate 408 including the copper-material electrodes or connections of set 214, to produce a protected populated substrate 508, illustrated in FIG. 5b. The surface of the populated substrate 508 is now sealed or protected, and further processing can be deferred, if desired. It should be noted that the attachment of the first layer 510 of Kapton dielectric material to the populated substrate is made with SPIE layer 512, rather than with the Ultem polyetherimide which is conventionally used.

Figure 5B:
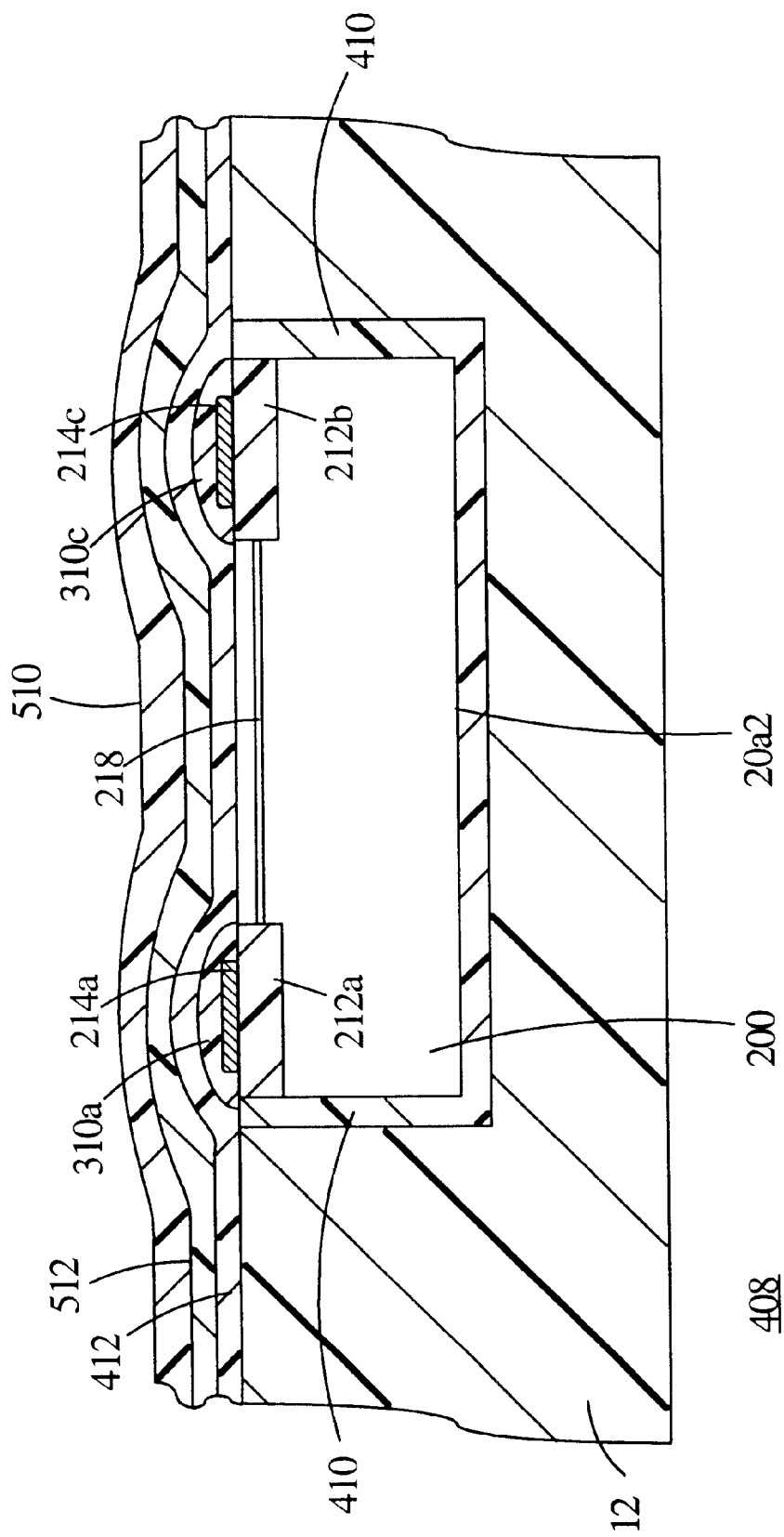
FIG. 5b illustrates the resulting structure.

The reason for this is that the Ultem requires processing at temperatures exceeding 190 degrees C., at which temperatures the ferrite-cap 216 attachment epoxy 218 of FIGS. 2 and 5a, 5b would be damaged. Also, regardless of the characteristics of the lid attachment epoxy 218, the close tolerances involved in attachment of the ferrite lid 216 and the insulators, 212a and 212b to the ferrite body 210, and the conductors which are located within the ferrite body, requires that the temperature excursions be moderate to prevent damage to the magnetic element 18.

Figure 6:
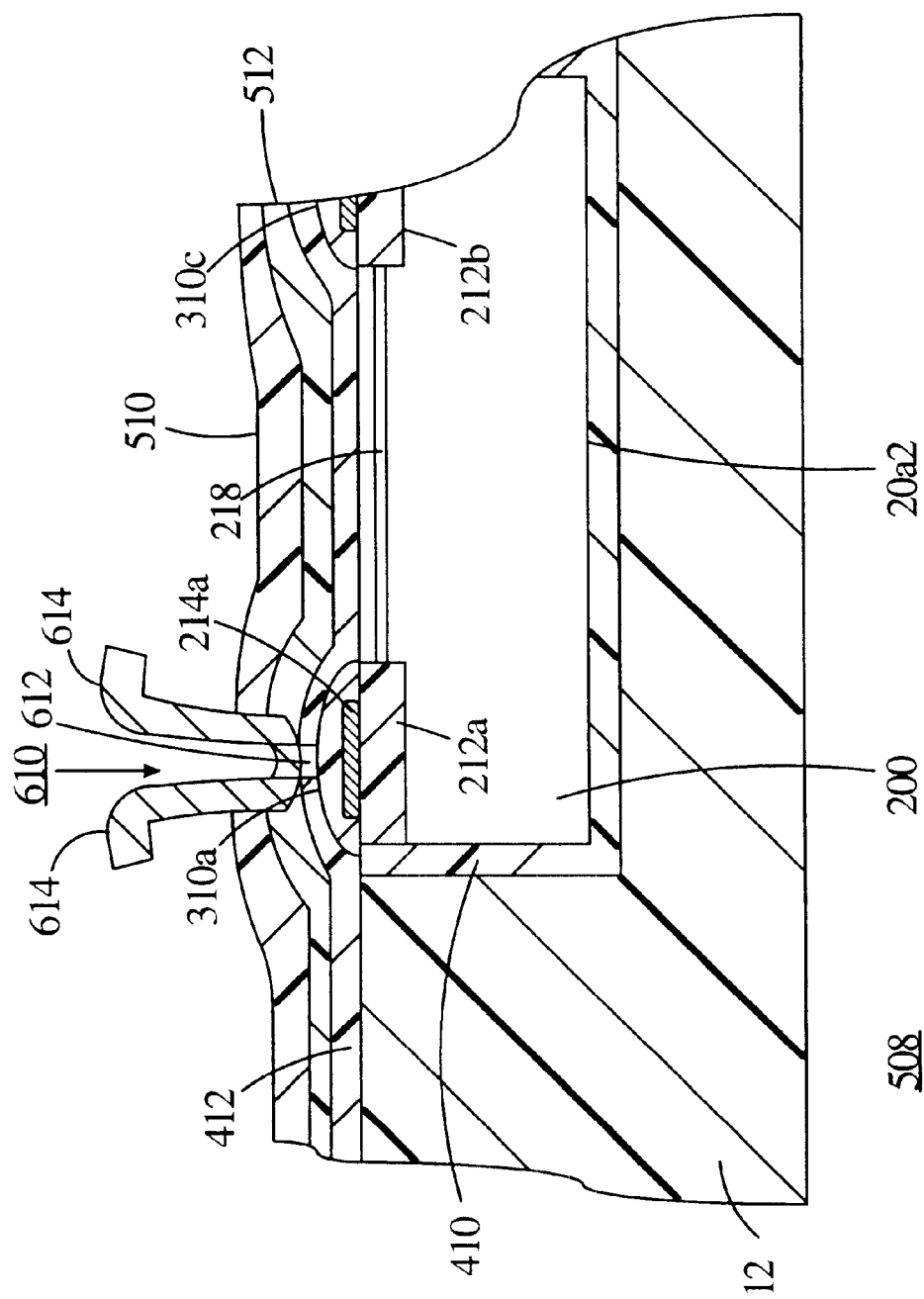
FIG. 6 illustrates the result of laser via drilling through a portion of the structure of FIG. 5b.

Following the lamination of the first layer 510 of Kapton dielectric to the populated substrate 508, the vias are laser-drilled in conventional manner over the locations of at least some of the copper-containing electrical contacts of set 214 of the components, down to the copper-containing material. One via 610 is illustrated in FIG. 6. The laser drilling generates soot and heat, and the localized heat tends to generate copper oxides at the exposed surface of the copper-containing contact. The oxides are represented as a layer 612 lying on copper-containing electrode 214, and the soot is illustrated as a layer of material 614 extending over the surface of the via 610 and over the oxide surface 612.

According to an aspect of the invention, a cleaning step cleans soot 614 from the exposed surfaces, including the via(s) 610 and the exposed copper-containing material 612 at the bottoms of the via(s) 610, and from the regions around the drilled via, where soot may accumulate. Following the soot removal, copper oxide removal is performed. The soot removal is performed by any conventional means, using reactive plasmas such as $CF_4$ plasma andor oxygen plasma. The soot tends to be in the form of silicon-containing compounds, which tend not to be volatile. The oxygen plasma, if used, oxidizes and vaporizes the carbon compounds associated with the soot. The fluorine-based plasma attacks the silicon-containing compounds, and converts them to volatile silicon tetrafluoride. If the copper-containing electrode were to be coated with titanium, the fluorine-based plasma etch would also attack the titanium surface, converting it to volatile $TiF_4$.

Figure 7:
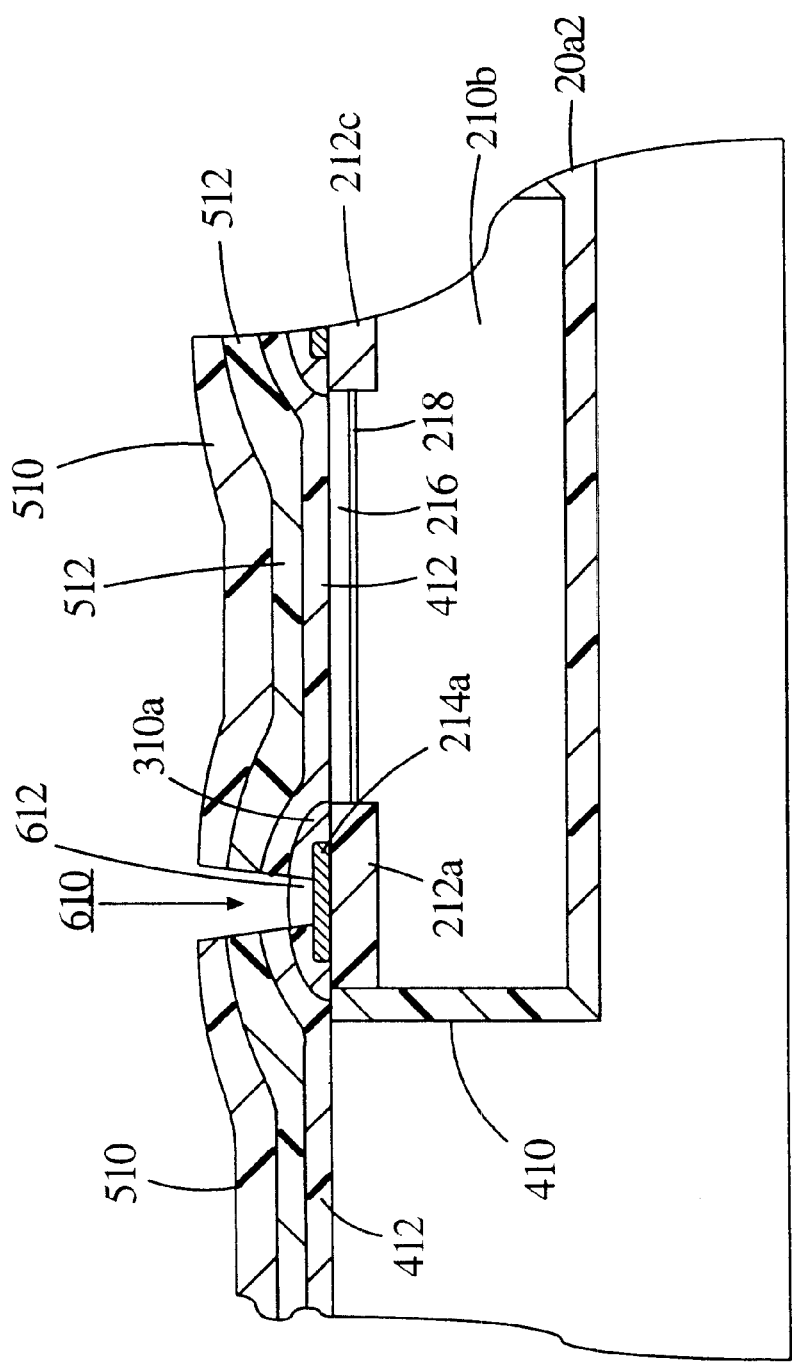
FIG. 7 illustrates the result of soot removal from the laser-drilled vias of FIG. 6.
Figure 8:
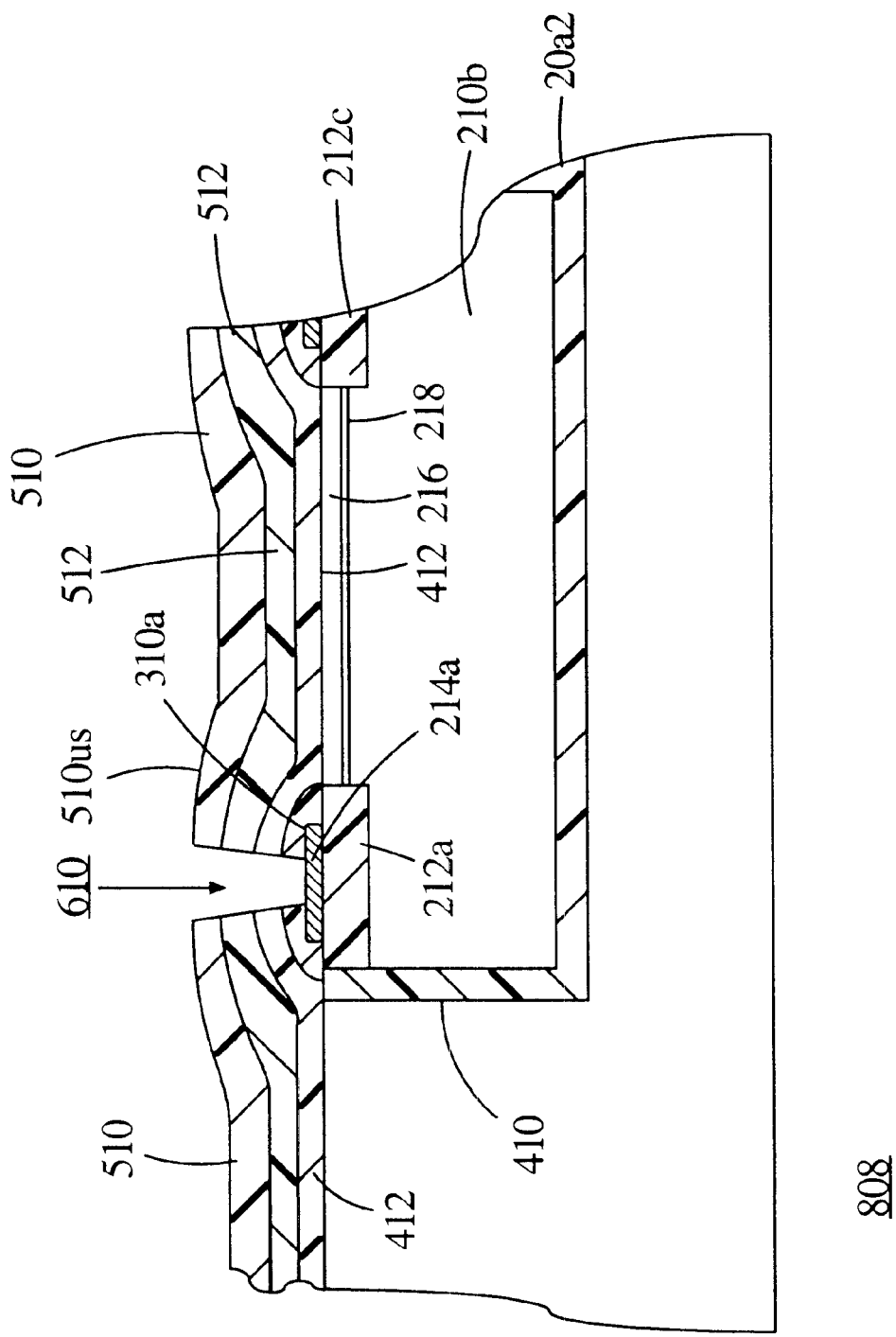
FIG. 8 illustrates the result of cleaning of that portion of the electrical contacts exposed by the vias in the soot-cleaned structure of FIG. 7.
Figure 9:
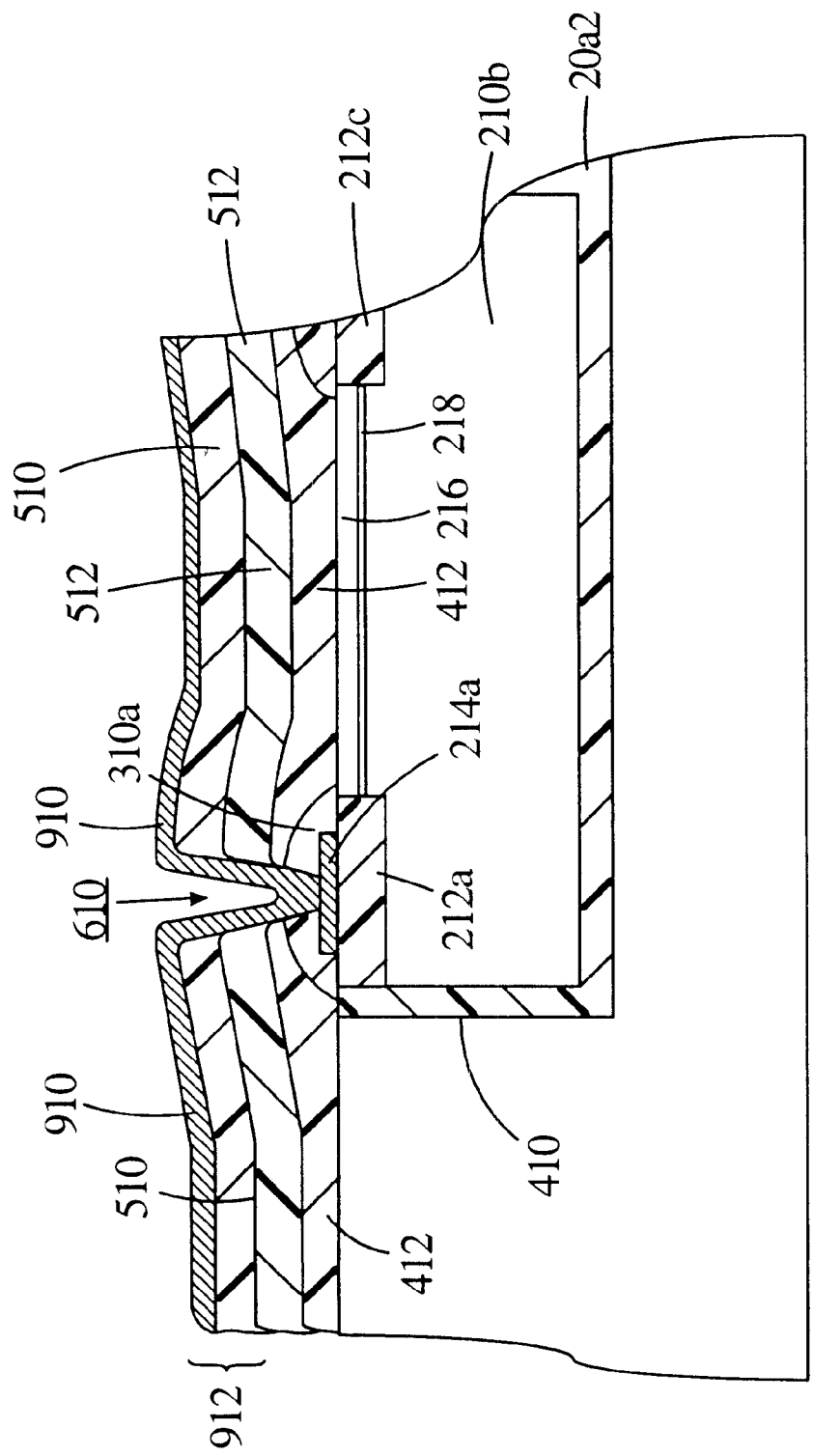
FIG. 9 illustrates the result of metallizing the exposed surface of the Kapton polyimide sheet to define a first layer of HDI interconnection.
Figure 10:
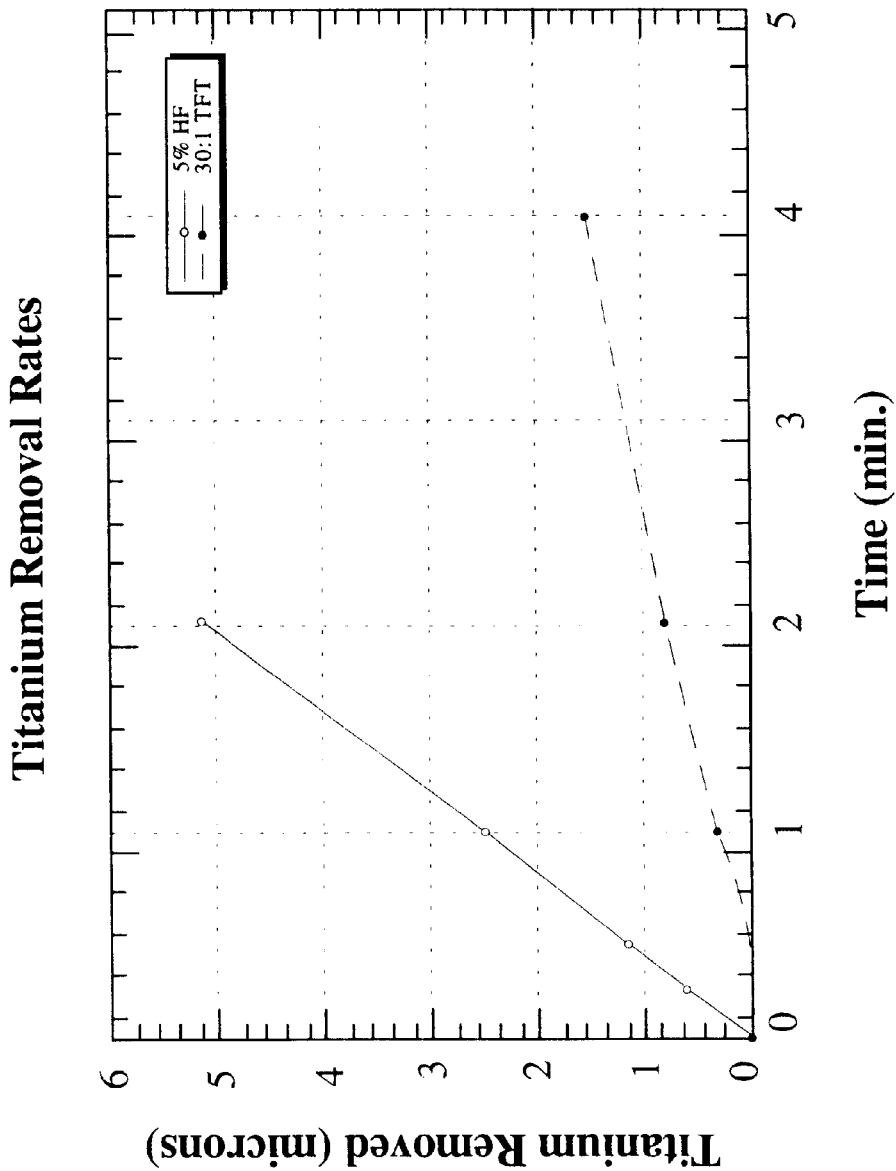
FIG. 10 is a plot of titanium removal versus time.

In the described situation, the laser drilling goes to a copper-containing layer, not a titanium layer. Consequently, the copper oxides contained in layer 612 must be removed or cleaned after the soot removal. The soot removal should precede the copper oxide cleaning, so that the presence of the soot does not interfere with the oxide removal. FIG. 7 illustrates the structure of FIG. 6, with the soot removed, which exposes the copper oxide containing layer 612. The copper oxide removal is accomplished by a second plasma treatment, which is a reactive argon plasma cleaning. Reactive argon plasma treatment is a conventional process, although it is not normally used in the context of HDI processing. The argon plasma cleaning of the copper-containing conductor electrode portions exposed at the bottoms of the vias is performed by exposing the entire laminated, populated substrate 708 of FIG. 7, dish via(s) 610 exposing the copper-containing electrodes 214a to be cleaned, to the argon plasma. Kapton is removed by the argon plasma at a rate of less than 40 Angstroms per minute. The argon plasma etch may be for a period of about 20 minutes, which has been found to be sufficient to remove copper oxides in the described aspects of the method according to the invention. However, longer or shorter periods of time may be used, as needed or desired, so long as the copper-containing electrodes are sufficiently cleaned of oxides, and the Kapton film is not excessively thinned. The resulting laminated, cleaned substrate with vias is illustrated in FIG. 8, and is ready for metallization of the first layer of Kapton in order to define the interconnection pattern. The condition of the substrate at this point is identical to the situation of a substrate during conventional HDI processing, and can proceed in known manner. Since clean copper is again exposed at the bottoms of the vias, the metallization steps should be performed immediately. In short, this known manner includes the steps of metallizing the Kapton and the vias with sputtered titanium, followed by sputtered copper, followed by electroplated copper, followed by sputtered titanium, all with patterning as may be required to define the conductive paths. FIG. 9 illustrates the composite layer 910 of metallization applied over the surface of Kapton polyimide layer 510, to thereby form an interconnection sheet designated 912. After the first layer of HDI interconnect is complete, additional layers can be added in known manner.

Other embodiments and methods of the invention will be apparent to those skilled in the art. For example, dielectric substrate 12 of FIG. 1 may be metallized on one or more of its surfaces, including interior surfaces of some or all wells, as may be desired for electrical shielding or continuity.

Thus, a method for making a high-density interconnection between at least one component (18) and one interconnection sheet (912) includes the step of procuring a component (18) having copper-containing electrical contacts (set 214) lying in a common plane (xy plane), and procuring a film of polyimide dielectric material (510). The method includes the laminating of the film (510) to at least the electrical contacts (set 214) of the component (18) using a layer (512) of silicone polyimide epoxy adhesive (SPIE). Following the laminating step, laser-formed vias (610) are defined through the film of polyimide epoxy adhesive (512), and any polyimide dielectric material (510) which may overlie the contacts (set 214), to at least some of the electrical contacts (set 214) of the component (18). As a result, soot (614) and copper oxides (612) may undesirably remain on the electrical,contacts (set 214). At least the vias (610) and that portion of the electrical contacts (set 214) exposed at the bottoms of the vias (610) are cleaned by at least argon reactive ion etching. Metallization (910) is applied to at least the cleaned vias (610) and contacts, to form a path for the flow of electricity through the film of polyimide dielectric material to the electrical contacts (set 214), and to thereby define the interconnection sheet (912). In one version of the method, the step of laminating the film to at least the electrical contacts (set 214) of the component (18) using a layer (512) of silicone polyimide epoxy adhesive includes the step of curing the silicone polyimide epoxy adhesive. The curing may take pace at a temperature not greater than about 190° C.

A method for making a high-density interconnection between at least one component (18) and a high-density interconnection sheet (912) according to another aspect of the invention includes the step of procuring a component (18) having copper-containing electrical contacts (set 214) lying in a common (xy) plane, and having a selected dimension (D) in a direction perpendicular to the common (xy) plane. In one version, the step of procuring the component (18) includes the step of procuring a magnetic component (18). The method also includes the step of procuring a dielectric substrate (12), which may be partially or wholly metallized, and which includes or defines a generally planar surface (12us). The generally planar surface (12us) defines a first aperture (14b) extending below the planar surface (12us) by the selected dimension (D) or otherwise dimensioned to accommodate the component (18) with the common plane (xy) substantially coincident with the planar surface (12us). The component (18) is fastened within the aperture (by epoxy 20a2, for example), with its electrical contacts (set 214) lying in a plane substantially coincident with the planar surface (12us). A film (510) of polyimide dielectric material is procured. The film (510) is laminated to at least the electrical contacts (set 214) of the component (18), and preferably to surrounding portions of the component (18), using a layer (512) of silicone polyimide epoxy adhesive, and the epoxy adhesive (512) is cured at a temperature not greater than about 190° C. Following the curing step, laser-generated vias (610) are formed through the film (510) of polyamide epoxy adhesive and any polyimide dielectric material (512) to at least some of the electrical contacts (set 214) of the component (18). If the copper or copper-containing contacts (set 214) are subject to laser action, soot (614) and copper oxides (610) may undesirably remain on the electrical contacts (set 214) after the lasering. At least the through vias (610) and that portion of the electrical contacts (set 214) exposed at the bottoms of the vias (610) are cleaned by at least argon reactive ion etching, to generate cleaned vias (610) and contacts (set 214). Following the cleaning, at least the cleaned vias (610) and contacts (set 214) are patterned if necessary, and metallized following the pattern, to thereby define the interconnection sheet (912), and to form a path for the flow of electricity through: the film of polyimide dielectric material (512) to the electrical contacts (set 214).

In one version of the method according to an aspect of the invention, the step of laminating the film (512) includes the step of applying the silicone polyimide epoxy adhesive (512) to a thickness of about $\frac{1}{5}$ ($10^{-4}$) meter. In another version, the step of procuring a component (18) includes the step of procuring a component (18) in which the electrical contacts (set 214) include a copper-containing material coated with titanium, and the cleaning step includes the preliminary step of reactive ion etching with titanium fluoride, to thereby remove the titanium.

In another mode of the method according to an aspect of the invention for fabricating a conductive via (610) between an upper surface (510us) of a dielectric sheet (510) and a metallization (such as a contact of set 214 or a ground plane) on a component (18) to which the via is to be connected, a component (18) is procured defining first (upper) and second (lower) substantially parallel surfaces, defining a thickness (D) therebetween, and including at least one electrical connection (214a) material on the first surface thereof, which electrical connection material includes copper. A substrate (12) defining a planar surface (12us) is provided. The substrate defines at least one well (14b) extending below the planar surface (12us), which well has a depth substantially equal to the thickness (D) of the component (18). The component (18) is mounted in the well (14b) with the first (upper) surface of the component (18) substantially coplanar with the planar surface (12us) of the substrate (12). A sheet (510) of polyimide dielectric material is bonded to at least the first (upper) surface of the component (18). A via (610) is formed using a laser. The via (610) extends through the sheet (510) of dielectric material at a location over the electrical connection material (214a) of the component (18). The formation of the via (610) using a laser undesirably tends to create soot (614), and also undesirably tends to create oxides of copper (612) on the electrical connection (214a) material. At least the via (610) and that portion of the electrical connection material exposed by the laser drilling action are cleaned by steps including (a) reactive ion etching using a fluorine-containing plasma; and (b) following the step of reactive ion etching using a fluorine-containing plasma, reactive-ion etching using an argon-containing plasma. Following the step of cleaning the via, metallization (910) is applied to the via (610) and to that portion of the electrical connection (214a) material exposed by the via (610).

What is claimed is:

1. A method for making a high-density interconnection between at least one component and one integrated circuit, said method comprising the steps of:

procuring a component having its copper-containing electrical contacts lying in a common plane;

procuring a film of polyimide dielectric material;

laminating said film to at least said electrical contacts of said component using a layer of silicone polyimide epoxy adhesive;

following said laminating step, laser-forming vias through said film of polyimide epoxy adhesive and any polyimide dielectric material to at least some of said electrical contacts of said component, whereby soot and copper oxides may remain on said electrical contacts;

cleaning at least said vias and that portion of said electrical contacts exposed at the bottoms of said vias by at least argon reactive ion etching, to generate cleaned vias and contacts; and metallizing at least said cleaned vias and contacts, to form a path for the flow of electricity through said film of polyimide dielectric material to said electrical contacts.

2. A method according to claim 1, wherein said step of laminating said film to at least said electrical contacts of said component using a layer of silicone polyimide epoxy adhesive includes the step of curing said silicone polyimide epoxy adhesive.

3. A method according to claim 2, wherein said step of curing said silicone polyimide epoxy adhesive is performed at a temperature not greater than about 190° C.

4. A method for making a high-density interconnection between at least one component and one integrated circuit, said method comprising the steps of:

procuring a component having its electrical contacts lying in a common plane, and a selected dimension in a direction perpendicular to said common plane, said electrical contacts being made from a copper-containing material, said component being subject to damage at elevated temperatures;

procuring a dielectric substrate, which may be partially or wholly metallized, said dielectric substrate including a generally planar surface, said surface defining a first aperture extending below said planar surface by said selected dimension and otherwise dimensioned to accommodate said component with said common plane substantially coincident with said planar surface;

fastening said component in said aperture with said electrical contacts lying in a plane coincident with said planar surface;

procuring a film of polyimide dielectric material;

laminating said film to at least said electrical contacts of said component using a layer of silicone polyimide epoxy adhesive;

curing said silicone polyimide epoxy adhesive at a temperature not greater than about 190° C.;

following said curing step, laser-forming vias through said film of polyimide epoxy adhesive and any polyimide dielectric material to at least some of said electrical contacts of said component, whereby soot and copper oxides may remain on said electrical contacts;

cleaning at least said vias and that portion of said electrical contacts exposed at the bottoms of said vias by at least argon reactive ion etching, to generate cleaned vias and contacts; and metallizing at least said cleaned vias and contacts, to form a path for the flow of electricity through said film of polyimide dielectric material to said electrical contacts.

5. A method according to claim 4, wherein said step of laminating said film includes the step of applying said silicone polyimide epoxy adhesive to a thickness of about ⅕ ($10^{-4}$) meter.

6. A method according to claim 4, wherein said step of procuring a component includes the step of procuring a component in which said electrical contacts include a copper-containing material coated with titanium; and said step of cleaning said vias includes the preliminary step of reactive ion etching with titanium fluoride, to thereby remove said titanium.

7. A method according to claim 4, wherein said step of procuring a component includes the step of procuring a magnetic component.

8. A method according to claim 4, wherein said step of procuring a component includes the step of procuring a magnetic component which is subject to damage at elevated temperatures.

9. A method for fabricating a conductive via between an upper surface of a dielectric sheet and a metallization on a component to which the via is to be connected, said method comprising the steps of:

providing a component defining first and second substantially parallel surfaces defining a thickness, said component including at least one copper-containing electrical connection material on said first surface thereof;

providing a substrate defining a planar surface, and also defining at least one aperture extending below said planar surface, said aperture having a depth substantially equal to said thickness of said component;

mounting said component in said aperture with said first surface substantially coplanar with said planar surface of said substrate;

bonding to at least said first surface of said component a sheet of polyimide dielectric material;

using a laser, forming a via extending through said sheet of dielectric material over said electrical connection material of said component, which tends to create soot, and also creates oxides of copper on said electrical connection material;

cleaning said via and that portion of said electrical connection material exposed by said via by steps including (a) reactive ion etching using a fluorine-containing plasma; and (b) following said step of reactive ion etching using a fluorine-containing plasma, reactive-ion etching using an argon-containing plasma; and following said step of cleaning said via, applying metallization to said via and to said portion of said electrical connection material exposed by said via.

* * * * *